United States Patent [19]
Hosoi

[11] Patent Number: 5,988,392
[45] Date of Patent: Nov. 23, 1999

[54] SHIPPING CONTAINER

[75] Inventor: Masato Hosoi, Itoigawa, Japan

[73] Assignees: Shin-Etsu Polymer Co., Ltd.; Shin-Etsu Handotai Co., Ltd., both of Tokyo, Japan

[21] Appl. No.: 09/128,101

[22] Filed: Aug. 3, 1998

[30] Foreign Application Priority Data

Sep. 1, 1997 [JP] Japan .................................. 9-235956

[51] Int. Cl.$^6$ .................................................. B65D 85/00
[52] U.S. Cl. ........................................... 206/711; 220/254
[58] Field of Search .................................. 206/710, 711, 206/712, 701, 719, 722, 723; 220/254

[56] References Cited

U.S. PATENT DOCUMENTS 4,804,086  2/1989  Grohrock ................................. 206/710

FOREIGN PATENT DOCUMENTS

| WO 96 11496 | 4/1996 | European Pat. Off. . |
| 0 774 774 A2 | 5/1997 | European Pat. Off. . |
| 63-82788 | 5/1988 | Japan . |
| 63-166948 | 10/1988 | Japan . |
| 4-505234 | 4/1992 | Japan . |
| 8-279546 | 8/1996 | Japan . |
| 9-107025 | 4/1997 | Japan . |
| 63-82788 | 5/1998 | Japan . |

OTHER PUBLICATIONS

"Ultra Clean Transport Container", IBM Technical Disclosure Bulletin, vol. 33, No. 10B, Mar. 1, 1991, pp. 56–58, XP000109868.

*Primary Examiner*—Jacob K. Ackun
*Attorney, Agent, or Firm*—Darby & Darby

[57] ABSTRACT

A container has a storage case for storing silicon wafers in alignment which is of a box-like configuration having an opening on its front side, with a multiple-number of fitting slots formed on the inner top and bottom faces near the front opening. The container further has a FIMS door for opening and closing off the front opening of the storage case, a gasket attached to the rim of the FIMS door, a latching mechanism provided in the FIMS door for causing engaging claws to fit into corresponding fitting slots when the FIMS door is attached and releasing the engagement of the engaging claws with the fitting slots when the FIMS door is removed, and an outer door for shipping, fitted on the front side where the storage case has been confined with the FIMS door, for covering the FIMS door.

3 Claims, 3 Drawing Sheets

SHIPPING CONTAINER

BACKGROUND OF THE INVENTION (1) Field of the Invention

The present invention relates to a shipping container for accommodating silicon wafers and the like.

(2) Description of the Prior Art

A conventional shipping container, although it is not illustrated, comprises: a storage case having an opening on the top; an inner receptacle for the correct alignment of silicon wafers (to be abbreviated as wafers hereinbelow) therein; a top door being fitted on the top opening of the storage case with a gasket in between to cover the inner receptacle for alignment; and a wafer pressing plate attached on the inner top surface of the top door. The thus configured top opening type shipping container holds a plurality of wafers placed upright in the inner receptacle for alignment, and is transported as appropriate.

Recent years, in order to reduce the development cost and manufacturing cost, unified standardization of wafers is in progress. This has been followed by a proposal of use of internationally standardized shipping containers. Such proposals of standardization have been made in view of development of large-sized wafers (transition to 300 mm or greater diameter wafers in the near future), which need improved positioning and precision alignment (to allow the unloader to perform high-speed accessing), as well as in view of reduction of various costs and to deal with development of the large-sized system and also automation.

Such a shipping container under the unified standards, although it is not shown, comprises: a storage case opening to the front; a Front-Opening Interface Mechanical Standard door (to be abbreviated as FIMS door hereinbelow) which opens and closes off the front opening of the storage case; a plurality of fitting slots formed on the inner peripheral surface of the storage case; and a latching mechanism which enables engaging claws to mate the fitting slots when the FIMS door is attached and to disengage the mating of the engaging claws with the fitting slots when the FIMS door is removed.

Such a front opening type shipping container accommodates plural wafers arranged vertically and this shipping container is transported from a semiconductor manufacturer to an IC manufacturer where it is automatically set in various processors. Subsequently, the latching mechanism is automatically disengaged by a working robot so that the FIMS door is automatically removed from the storage case and then the plurality of wafers are successively taken out from the storage case by the unloader in an automatic manner.

The prior art documents for configurations of this type include Japanese Utility Model Application Laid-Open Sho 63 No. 82,788, Japanese Utility Model Application Laid-Open Sho 63 No. 166,948, Japanese Patent Application Laid-Open Hei 8 No. 279,546 and Japanese Patent Application Laid-Open Hei 9 No. 107,025.

The shipping containers satisfying the unified standard are thus configured and are effective in improving the positioning precision, reducing various costs and promoting automation, but still give rise to a problem with respect to transport. Specifically, a shipping container of the unified standard is effective enough for in-plant transport between the processing sites but having only a FIMS door cannot provide high enough strength to ensure sufficient confinement for long distance transport using airplanes or trucks from a semiconductor manufacturer to an IC manufacturer because the container is exposed to various external environments (including pressure variations, vibrations during flight, etc.). Resultantly, the wafers maybe polluted with particles or subject to organic pollution, which may be accompanied by the entrance of the external air, so that there is the fear that the wafers cannot be retained in high enough quality.

SUMMARY OF THE INVENTION

The present invention has been devised in view of the above problems, and it is therefore an object of the present invention to provide a shipping container which is capable of keeping a sufficient enough confinement and retaining the content in high quality even if the container is exposed to various external environments.

In order to achieve the above object, the present invention is configured as follows:

In accordance with the first aspect of the invention, a shipping container comprises:

a storage case for accommodating articles, which is of a box-shape having an opening on one side thereof;

an inner door which opens and closes off the opening face of the storage case;

a sealing member provided for the inner door to seal the clearance between the storage case and the inner door; and an outer door for covering the inner door, fitting the face of the opening of the storage case that has been closed.

In accordance with the second aspect of the invention, the shipping container having the above first feature, further comprises clamping means for attaching and fixing the outer door, wherein the clamping means has a projection, provided on the outer peripheral surface of the storage case and an engaging member provided on the rim of the outer door for engaging the projection when the outer door is fitted to the case.

In accordance with the third aspect of the invention, the shipping container having the above first feature, further comprises clamping means for attaching and fixing the outer door, wherein the clamping means comprises: a first opposing seat projected from the outer peripheral surface of the storage case; and a second opposing seat projected from the rim of the outer door so as to abut the first opposing seat when the outer door is fitted to the case; and a gripping member for holding the first and second opposing seats.

'Articles' referred to in the present invention include, at least, various thin plates used in electric and electronic industries and semiconductor manufacturing industries, such as quartz glass, substrates, semiconductor wafers.

In accordance with the first aspect of the invention, when the articles are transported using the shipping container, the opening face of the storage case containing articles such as precision wafers or other substrates, is closed and sealed with the internal door. After the inner door has been locked, the outer door is placed over the inner door to allow for shipment. The shipping container will be transported using various types of transportation such as airplanes, ships, trucks and the like. Since the outer door for shipping enhances the sealing effect and prevents the inner door from being deformed or dropping off, the container can ensure high enough hermetic confinement regardless of external environments.

Further, in accordance with the second and third invention, after the inner door has been locked, the outer door is set covering the face in which the opening of the storage case has been confined by the inner door, using the clamping means. The attachment of the outer door using this clamping means prevents the outer door from easily coming off, and hence increases the hermitic confinement.

DESCRIPTION OF THE PREFERRED EMBODIMENTS

Figure 1:
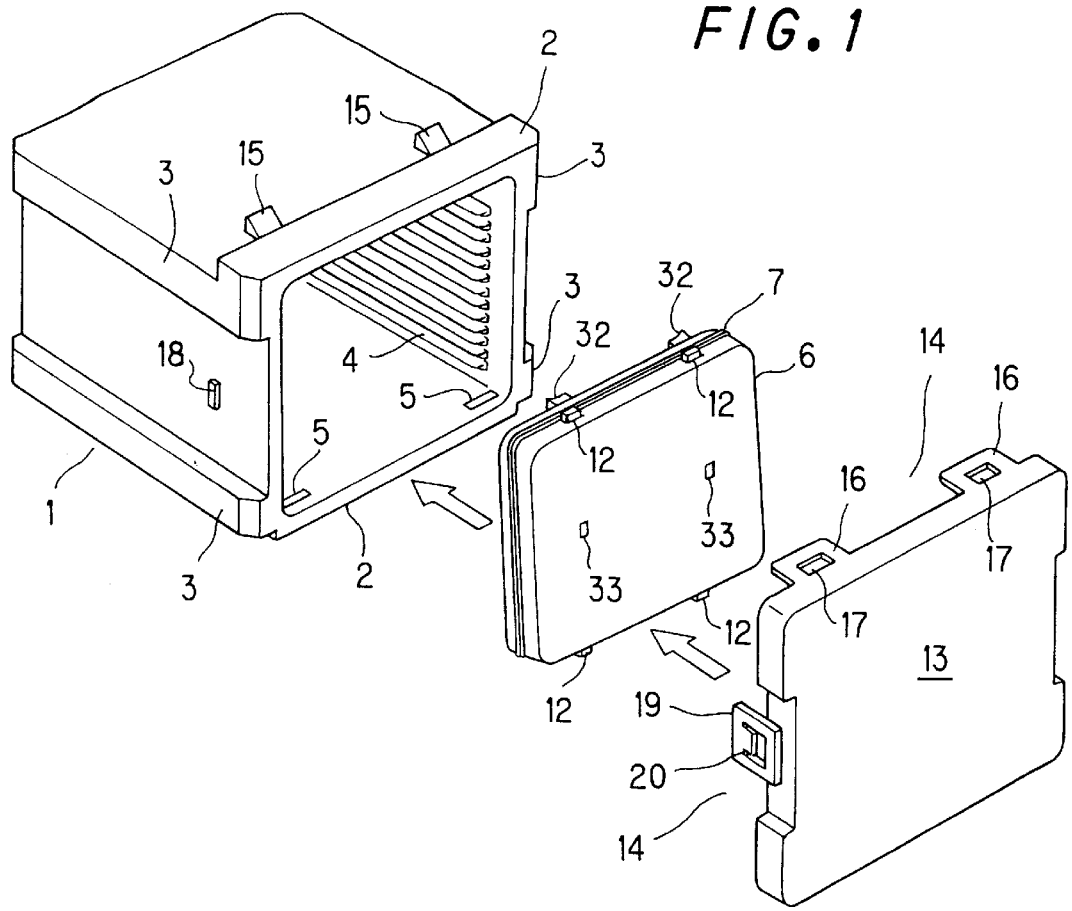
FIG. 1 is an exploded perspective view showing an embodiment of a shipping container in accordance with the invention.

The embodiments of the invention will hereinafter be described with reference to the accompanying drawings. A shipping container of one embodiment includes: as shown in FIG. 1, a storage case 1; a FIMS door 6; an outer door 13; and a clamping means 14. It should be noted that FIMS door 6 has a latching mechanism 8 therein as will be discussed with reference to FIG. 6 and having a sectional structure (cut on a plane 100–101) shown in FIG. 7.

Storage case 1 has a box configuration of a front opening type having an opening on the front side, composed of a resin excellent in mechanical property, staining resistance and formability such as polycarbonate, acrylic resin, polyethylene terephthalate, polyacetal, PEEK or combination of the these, with fillers or additives blended to provide conductivity. Of these, polycarbonate which has excellent transparency and mechanical strength is most preferred.

This storage case 1 comprises: a pair of flanges 2 which are integrally formed therewith on the top and bottom sides at the opening rim and extended to sides; and flanges 3 which are formed on both the sides of the case, integrally formed with flange 2 and extended from the front to the rear along the top and bottom edges of the case. Storage case 1 has a plurality of aligning ribs 4 integrally formed on the both sides therewith, with a predetermined pitch (for example, with a pitch of 10 mm) so that a plurality (e.g., 25 pieces) of wafers (not shown) will be supported at a level and stored vertically in alignment. Formed on the top and bottom near the front opening inside storage case 1 are a plurality of hollows as fitting slots 5 with a predetermined interval.

Figure 6:
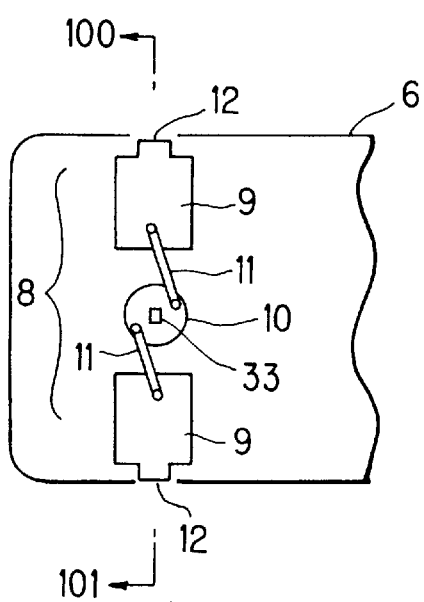
FIG. 6 is a front view showing the latching mechanism inside a FIMS door of the shipping container shown in FIG. 1.
Figure 7:
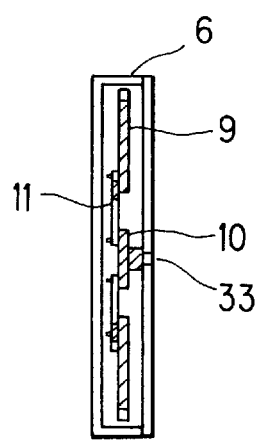
FIG. 7 is a sectional view showing the 100–101 section in FIG. 6.

FIMS door 6 is composed of a light-weight rectangular plate with its corners beveled, made up of elastomer, polycarbonate, polypropylene or the like. A rectangular shaped gasket 7 is adhered around the rim of the door. The FIMS door also has one or more of retainers 32 attached on the interior side thereof, having toothed projections arranged at regular intervals so as to avoid the wafers moving within aligning ribs. The FIMS door further has a latching mechanism 8 therein. The gasket is made of olefin elastomer, polyester elastomer, styrene elastomer, silicone rubber, fluoroplastic rubber or the like. Retainers 32 are made of polyester elastomer, polypropylene, polyethylene polybutylene terephthalate or the like. This latching mechanism 8, is arranged inside FIMS door 6 as shown in FIGS. 1, 6 and 7, and is composed of a pair of plates 9 supported vertically, movably, by a plurality of linking members; a disk 10 which is disposed rotatably between the paired plates 9 and has a key hole 33 at the center thereof that enables external manipulation of the latching mechanism; and a pair of movable rod-like elements 11 which each connect plate 9 with disk 10 via a pin. Each plate 9 has an engaging claw 12 projecting from its upper or lower part so as to fit into corresponding fitting slot 5. Here, FIMS door 6 is provided with one or two key holes 33, depending upon the number of latching mechanisms 8.

Figure 2:
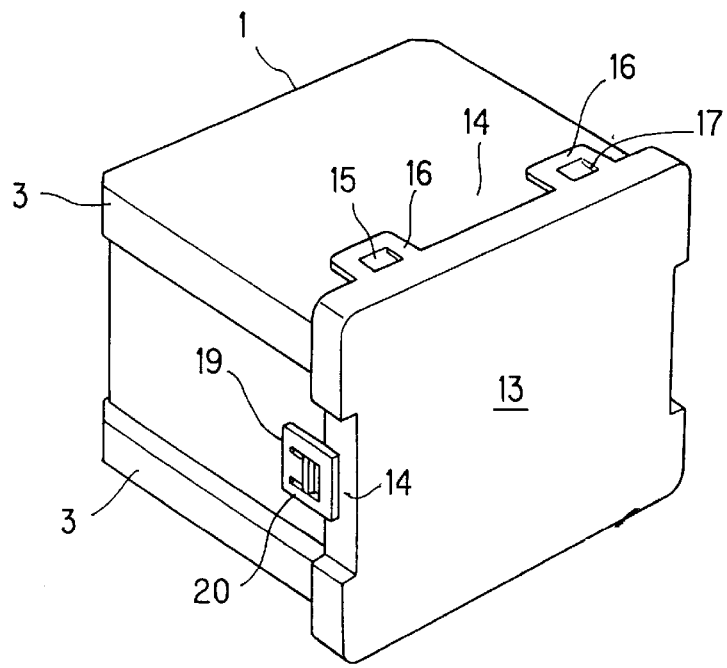
FIG. 2 is a perspective view showing an embodiment of a shipping container in accordance with the invention.

Outer door 13 is formed of a material excellent in mechanical property, rigidity, hardness and formability such as polycarbonate, polybutylene terephthalate, polyacetal, acrylic resin, PEEK or the like or of a metallic material. This outer door 13, as shown in FIG. 2, has internally depressed portions formed in the middle part on both sides thereof so as to correspond to the opening front face of storage case 1.

Clamping means 14 comprises a plurality of elements such as fitting projections 15, engaging pieces 16, engaging projections 18 and engaging hooks 19. Fitting projection 15 has a triangular section and some or several projections 15 are integrally formed near the rim of the opening on the top and bottom of storage case 1. A plurality of engaging pieces 16 are integrally formed with outer door 13, each extending from the top or bottom face of the rim of outer door 13 and having a rectangular hole 17. A plurality of engaging projections 18 are integrally formed near the rim of the opening on the left and right sides of storage case 1. A plurality of engaging hooks 19 are formed on the left and right sides of the rim of outer door 13, each extending from the depressed portion in the middle part thereof. Further, this hook 19 is provided in a swayable manner and has an anti-skid surface 20.

When shipping containers of the above configuration are used for transport from a semiconductor manufacturer to an IC manufacturer, first a number of sliced wafers are stored in alignment vertically in layers. Thereafter, FIMS door 6 is automatically fitted to the front opening of storage case 1 and disk 10 of latching mechanism 8 is automatically rotated in a locking direction by the working robot. With that movement, with the rotation of disk 10, a pair of plates 9 slide upward and downward through elements 11 so that engaging claws 12 fit into corresponding fitting slots 5 to thereby firmly lock FIMS door 6. In this state, FIMS door 6 is held at the top of the opening of storage case 1 by the contraction repulsive force of gasket 7.

For ensuring the sealing performance of the gasket under continuous usage, the gasket is made of a material having a hardness of 80 or less or preferably 60 or less under the testing method specified by JIS K6301A.

When FIMS door 6 has been locked in the above way, outer door 13 is mounted with a gasket or sealing fixed in between by manually coupling engaging pieces 16 with fitting projections 15 and coupling engaging hooks 19 with engaging projections 18 so that the container can be shipped. In this way, the shipping container will be transported from a semiconductor manufacturer to an IC manufacturer or the like by an airplane or truck as appropriate. Because of the toughness of outer door 13 for shipment, the container is effectively sealed and protected so that it is possible to readily ensure high enough hermetic confinement to protect it from any external environment. As a result, regardless of whether the transport time period is long or not, no particle or organic pollution of the wafers due to entrance of external air into the container will occur, thus it is possible to keep the wafers at high quality.

When the shipping container arrives at the IC manufacturer, engaging pieces 16 are disengaged from fitting projections 15 and engaging hooks 19 are disengaged from engagement projections 18, by hand, so that outer door 13 is removed. Then the container is set on an opener/loader. After this, disk 10 in latching mechanism 8 is automatically rotated in an unlocking direction by the working robot so that the paired plates 9 slide upward and downward through elements 11 and engaging claws 12 retract from fitting slots 5 to allow for removal of FIMS door 6. Thereafter, FIMS door 6 is automatically detached from the front of storage case 1, and a plurality of wafers are successively picked up. During this operation, since the wafers are arranged vertically with their stance kept horizontally, there is no need to change the position of the shipping container, thus making it possible to achieve a markedly smooth, efficient and easy operation.

Figure 3:
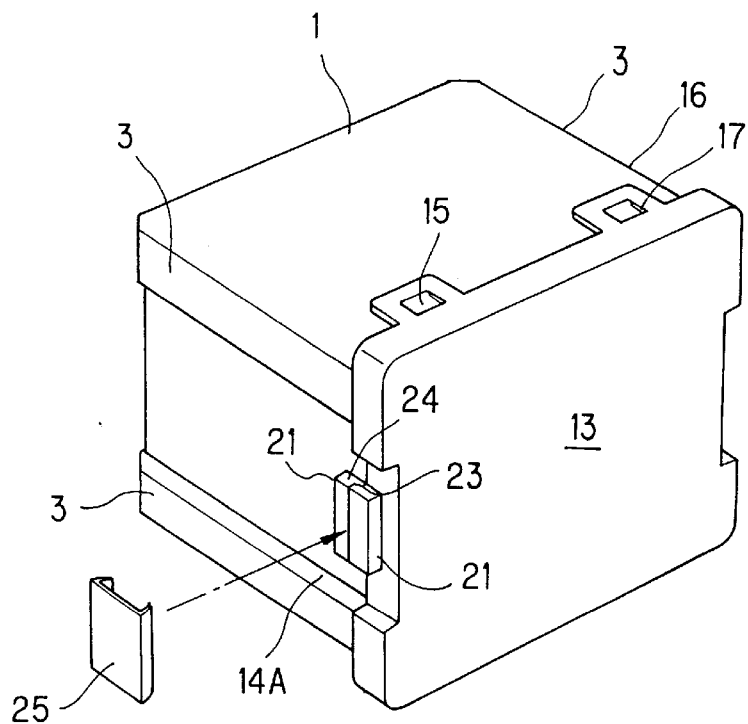
FIG. 3 is a perspective view showing a second embodiment of a shipping container in accordance with the invention.

Next, FIG. 3 shows a second embodiment of the invention. In this case, clamping means 14A is composed of fitting projections 15, engaging pieces 16, first opposing seats 21, second opposing seats 22 and fastening elements 25.

A pair of first opposing seats 21 are bulge formed integrally on both sides of storage case 1 near the opening rim, each being scarf formed with a notched face 24 on the front. The second opposing seats 22 also are bulge formed integrally on both sides of outer door 13, each being scarf formed with a corresponding notched face 23. These notched face 23 of outer door 13 and notched face 24 of the first opposing seat 21 fit together when outer door 13 is mounted and fixed.

Fastening element 25 is composed of elastomer, polycarbonate, polypropylene or the like so as to be flexible and is formed so as to have a U-shaped section. This element is used to grip the distal sides of the scarfs of first and second opposing seats 21 and 22 when outer door 13 is mounted and fixed. Other configurations are the same as that described in the previous embodiment.

In this arrangement, after FIMS door 6 has been locked, engaging pieces 16 are manually coupled with fitting projections 15 while first and second opposing seats 21 and 22 are manually put together and then fastening elements 25 are attached to ensure the fixing of outer door 13. Thus, outer door 13 can be mounted and firmly fixed with a relatively simple configuration to allow for shipment. It is apparent that this embodiment also provides the same effects as those stated in the previous embodiment.

Figure 4:
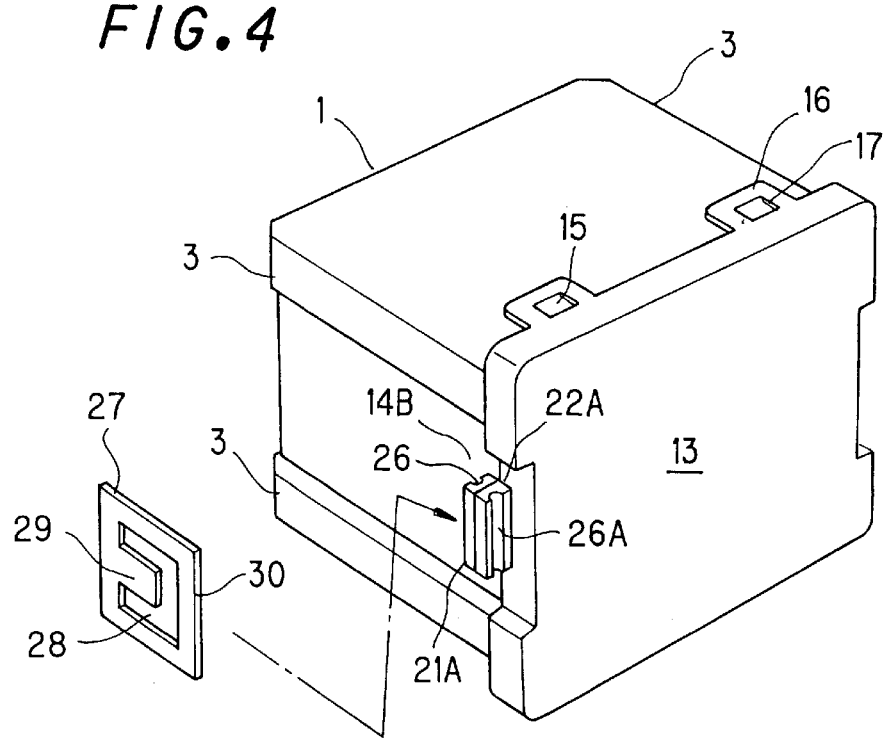
FIG. 4 is a perspective view showing a third embodiment of a shipping container in accordance with the invention.

Next, FIG. 4 shows a third embodiment of the invention. In this case, clamping means 14B is composed of fitting projections 15, engaging pieces 16, first opposing seats 21A, second opposing seats 22A and gripping plates 27.

A pair of first opposing seats 21A are bulge formed integrally on both sides of storage case 1 near the opening rim with their distal sides formed with cylindrical engaging grooves 26 (having a substantially semi-circular section). The second opposing seats 22A also are bulge formed integrally on both sides of outer door 13 with their distal sides formed with cylindrical engaging grooves 26A (having a substantially semi-circular section). Each gripping plate 27 is composed of elastomer, polycarbonate, polypropylene or the like so as to be, essentially, a flexible rectangular plate. This plate is formed with a U-shaped slot 28 in the approximate center thereof to separately define an inner gripping element 29 and an outer gripping element 30. Other configurations are the same as that described in the previous embodiments.

In this arrangement, after FIMS door 6 has been locked, engaging pieces 16 are manually coupled with fitting projections 15 while the first and second opposing seats 21A and 22A are manually put together with a gasket in between and then gripping plates 27 are attached so as to hold engaging grooves 26 and 26A between inner and outer gripping elements 29 and 30 thereof by pressing gripping plate 27 onto the side face of storage case 1 to ensure the fixing of outer door 13. Thus, outer door 13 can be mounted and firmly fixed with a relatively simple configuration to allow for shipment. It is apparent that this embodiment also provides the same effects as those stated in the previous embodiments.

Figure 5:
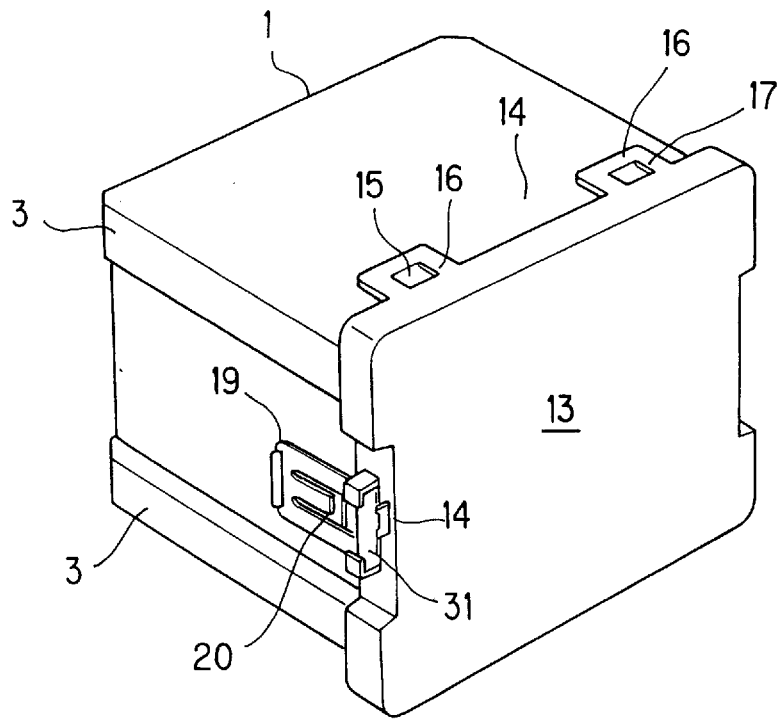
FIG. 5 is a perspective view showing a fourth embodiment of a shipping container in accordance with the invention.

FIG. 5 shows the fourth embodiment in which clamping means 14 has a rotary shaft 31. Specifically, a clamp having rotary shaft 31 is fitted removably to the outer door so that the clamp can be rotationally held. With this configuration, the clamp parts remain engaged with the outer door when the outer door is removed from the container so that there is no need for safe-keeping of detached clamp parts. Further, since the clamp parts can be removed for cleansing and drying the outer door, this configuration is advantageous in improving the operability for cleansing and drying.

The above embodiments were illustrated using an example of storage case 1 of FIG. 1, however the invention should not be limited to this configuration. For example, the storage case may be of an oval section, an elliptic section, a polygonal section or the like. Further, the storage case may be formed of a translucent configuration. It is also possible to increase or decrease the number of aligning ribs 4 as appropriate. Additionally, a plurality of fitting slots 5 may be provided on the top and bottom and left and right sides inside storage case 1. Gasket 7 may be changed as appropriate, as to its material, number, shape and/or structure. Latching mechanism 8 should not be limited to the aforementioned configuration but can be modified as appropriate or may be substituted as appropriate, with a well-known configuration (for example, disclosed in Japanese Patent Application Disclosure Hei 4 No. 505,234).

For example, one or more plates 9 can be provided, inside and/or on the rear side of, FIMS door 6, or one or more engaging claws 12 may be projected as appropriate from top and bottom and/or left and right sides of a plate 9. A cam element, threaded element, rack-and-pinion etc. may be used to slide plate 9. In place of latching mechanism 8, an opening and closing mechanism using a plurality of magnets can be used. Outer door 13 may be of any material, be of any manufacturing method, of any shape or configuration as long as it has a similar function.

In the above embodiments, although clamping means 14, 14 and 14B which are all manually operated, were illustrated, the clamping means should not be limited to these and may be of a mechanical clamping means that can be automatically manipulated by a machine. Further, clamping means should not be limited to those described above (14, 14A and 14B), but can be modified as appropriate, or may be replaced with a well-known prior art configuration (for example, disclosed in Japanese Utility Model Application Laid-Open Sho 63 No. 166,948 etc.). For example, in the second and third embodiments, fitting projections 15 and engaging pieces 16 may be omitted. Alternatively, clamping means such as dovetail joint configuration, mortise and tenon configuration etc., of course, may be used.

As described heretofore, the first configuration of the invention is effective in maintaining high enough hermetic confinement and hence retains the content in high quality even when the container is exposed to any external environment.

Further, the second and third configurations of the invention prevent the outer door from coming off easily and further maintain enough hermetic confinement and hence can maintain the content in high quality.

What is claimed is:

1. A shipping container comprising:

a storage case for accommodating articles, the storage case having a box-shape with a front side, an opening in said front side, a plurality of substrate aligning ribs on opposing inner walls, at least one fit slot formed near the opening inside the storage case, and at least one projection integrally formed near the rim of the opening;

an inner door adapted to open and close the opening of the storage case, said inner door having a latching mechanism with at least one movable member adapted to engage said at least one fit slot;

a sealing member provided for the inner door to seal a clearance between the storage case and the inner door; and an outer door for covering the inner door, said outer door being provided with a first clamping means for sealable attaching and fixing said outer door on an outer peripheral surface of the storage case, wherein said first clamping means has at least one engaging member provided for engaging said at least one projection when the outer door is fitted to the case.

2. The shipping container according to claim 1, further comprising second clamping means for attaching and fixing the outer door, wherein the second clamping means comprises: a first opposing seat projected from the outer peripheral surface of the storage case; a second opposing seat projected from the rim of the outer door so as to abut the first opposing seat when the outer door is fitted to the case; and a gripping member for holding the first and second opposing seats.

3. The shipping container according to claim 1, wherein said at least one engaging member is an engaging piece extending from a top or a bottom face of a rim of the outer door, each engaging piece having a hole for engaging said at least one projection.

* * * * *